United States Patent
Lin et al.

(10) Patent No.: US 11,164,825 B2
(45) Date of Patent: Nov. 2, 2021

(54) COWOS INTERPOSER WITH SELECTABLE/PROGRAMMABLE CAPACITANCE ARRAYS

(71) Applicant: TAIWAN SEMICONDUCTOR MANUFACTURING CO., LTD., Hsinchu (TW)

(72) Inventors: Liang-Chen Lin, Hsinchu County (TW); Shih-Cheng Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/601,829

(22) Filed: Oct. 15, 2019

(65) Prior Publication Data

US 2020/0135667 A1    Apr. 30, 2020

Related U.S. Application Data

(60) Provisional application No. 62/753,883, filed on Oct. 31, 2018.

(51) Int. Cl.
*H01L 23/62* (2006.01)
*H01L 23/64* (2006.01)
(Continued)

(52) U.S. Cl.
CPC ............ *H01L 23/62* (2013.01); *H01L 23/481* (2013.01); *H01L 23/642* (2013.01); *H01L 24/17* (2013.01);
(Continued)

(58) Field of Classification Search
None
See application file for complete search history.

(56) References Cited

U.S. PATENT DOCUMENTS

| 5,896,050 A | 4/1999 | Durham et al. |
| 8,993,380 B2 | 3/2015 | Hou et al. |

(Continued)

FOREIGN PATENT DOCUMENTS

| CN | 101236956 A | 8/2008 |
| CN | 101632173 A | 1/2010 |

(Continued)

*Primary Examiner* — Nicholas J Tobergte
*Assistant Examiner* — Kien C Ly
(74) *Attorney, Agent, or Firm* — McDermott Will & Emery LLP

(57) ABSTRACT

An interposer circuit includes a substrate and a dielectric layer that is disposed on top of the substrate. The interposer circuit includes two or more connection layers including a first connection layer and a second connection layer that are disposed at different depths in the dielectric layer. The interposer circuit includes a fuse that is disposed in the first connection layer. The first connection layer is coupled to a first power node and the second connection layer is coupled to a first ground node. The interposer circuit further includes a first capacitor that is in series with the fuse and is connected between the first and the second connection layers. The interposer circuit also includes first, second, and third micro-bumps on top of the dielectric layer such that the fuse is coupled between the first and second micro-bumps and the first capacitor is coupled between the second and third micro-bumps.

20 Claims, 16 Drawing Sheets

(51) Int. Cl.
*H01L 23/00* (2006.01)
*H01L 23/48* (2006.01)

(52) U.S. Cl.
CPC ............... *H01L 2224/12105* (2013.01); *H01L 2225/06517* (2013.01)

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,385,079 B2 | 7/2016 | Chang et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2010/0230780 A1 | 9/2010 | Obayashi |
| 2011/0096521 A1* | 4/2011 | Randall .................. H01L 23/50 361/782 |
| 2015/0123265 A1 | 5/2015 | Lowney et al. |
| 2015/0214150 A1* | 7/2015 | Chang ................. H01L 23/5223 257/529 |
| 2018/0175137 A1 | 6/2018 | Chiou et al. |

FOREIGN PATENT DOCUMENTS

| | | |
|---|---|---|
| CN | 104810148 A | 7/2015 |
| CN | 108028241 A | 5/2019 |
| TW | 201535666 A | 9/2015 |

\* cited by examiner

COWOS INTERPOSER WITH SELECTABLE/PROGRAMMABLE CAPACITANCE ARRAYS

PRIORITY CLAIM AND CROSS-REFERENCE

This application claims priority to U.S. Provisional Application No. 62/753,883 filed on Oct. 31, 2018, entitled "CoWoS Interposer with Selectable/Programmable Capacitance arrays," the entire disclosure of which is incorporated herein by reference.

BACKGROUND

Chip on wafer on substrate (CoWoS) is a wafer-level multi-chip packaging method that integrates multiple small chips (chiplets) side-by-side on an interposer. A chiplet that may be a system on chip (SOC) is bound to the interposer through micro-bump connections that are on top of the interposer. The interposer uses through-silicon vias (TSVs) such that the TSVs are connected from the bottom of the interposer to micro-bump connections on the substrate. The interposer for the CoWoS receives electrical power connections via the solder-bump connections on the substrate and provides the electrical power connections via micro-bump connections on top of the interposer to the chiplets.

Simultaneous switching of the circuits of the chiplets, e.g., circuits of the SOCs, can momentarily draw a considerable amount of current in the form of current spikes and induce the simultaneous switching noise (SSN) in the form of voltage spikes on the electrical power connections, e.g., the micro-bump connections. Thus a chiplet on top of the interposer may receive the SSN through the micro-bump connections because of simultaneous switching in other chiplets. Capacitors can be incorporated in the interposer between the micro-bump connections, e.g., between a power connection and a ground connection, such that voltage spikes on the power connection is drained, e.g., transferred, to the ground through the capacitors and thus do not affect, e.g., harm, the circuits of the chiplet. The capacitors can be faulty and may drain considerable amount of DC power and may heat up the interposer. It is desirable to disable the faulty capacitors and use the non-faulty capacitors for draining the voltage spikes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
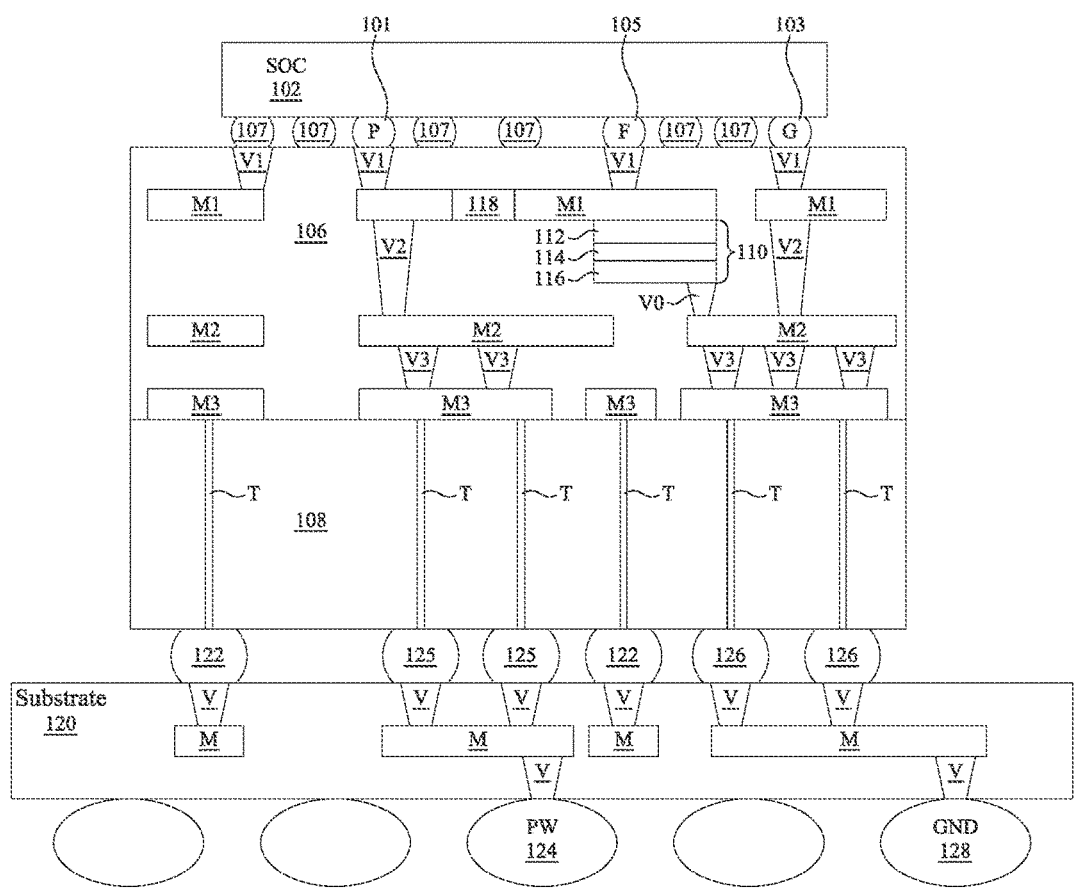
FIG. 1 illustrates a cross-sectional view of a SOC that is electrically connected, via an exemplary interposer, to a substrate to provide electrical power connections from the substrate to the SOC in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to an interposer that can be disposed on top of a substrate to provide electrical connection between the substrate and a plurality of chiplets, e.g., SOCs, that are disposed on top of the interposer. In particular, the interposer connects, from the bottom, to the solder-bumps on top of the substrate and receives power and ground connections from the substrate via the solder-bumps on top of the substrate. In addition, the interposer provides the power and ground connections to the plurality of chiplets on top of the interposer. In some embodiments, the interposer includes a plurality of dice such that each die is designed to receive a chiplet at the top of the interposer. Also, each die is designed to receive power and ground connections from the substrate and to provide the power and ground connections, via micro-bumps of the die on top of the interposer, to a chiplet that is placed on top of the interposer in the die.

In some embodiments, in addition to the solder-bumps for the power and ground connections, the substrate includes one or more other solder-bumps for signal connections. The interposer connects, from the bottom, to the other solder-bumps on top of the substrate and receives signal connections from the substrate via the other solder-bumps on top of the substrate. Also, each die is designed to receive the signal connections from the substrate and to provide one or more of the signal connections, via micro-bumps of the die on top of the interposer, to the chiplet that is placed on top of the interposer in the die. In some embodiments, the signal connections provide command and communication signals between the substrate and the chiplets.

FIG. 1 illustrates a cross-sectional view of a SOC that is electrically connected, via an exemplary interposer, to a substrate to provide electrical power connections from the substrate to the SOC in accordance with some embodiments of the present disclosure. FIG. 1 includes a substrate 120, an interposer 104, and a SOC 102. In some embodiments, the substrate 120 is connected, at the bottom, through a solder-bump 124 to a power node (positive node) of a power source such as a power supply. The substrate 120 is also connected, at the bottom, through a solder-bump 128 to a ground node (negative node) of the power source (not shown). In some embodiments, the substrate 120 also provides the power and ground connections through solder-bumps on top of the substrate 120. The substrate 120 provides electrical connection between the solder-bump 128 that is connected to the ground node and the solder-bumps 126 on top of the substrate 120 by means of vias V and connection layer M (e.g., metal layer). Thus, the solder-bumps 126 on top of the substrate 120 may provide the ground connection at the solder-bumps 126 to a chiplet that is connected to one or both of the solder-bumps 126. In addition, the substrate 120 provides electrical connection between the micro-bump 124 that is connected to the power node and the solder-bumps 125 on top of the substrate 120 by means of vias V and connection layer M. Thus, the solder-bumps 125 on top of the substrate 120 may provide the power connection at the solder-bumps 125 to a chiplet that is connected to one or both of the solder-bumps 125. In some embodiments, the substrate 120 includes one or more circuits (not shown) that provide one or more output signals and receives one or more input signals. The one or more circuits of the substrate 120 may receive the input signals from the interposer 104 or via the interposer 104 from the SOC 102 and also may provide output signals through solder-bumps 122, vias V, and connection layer M to the interposer 104 or via the interposer 104 to the SOC 102.

The interposer 104 of FIG. 1 provides an interface circuit between the substrate 120 and the SOC 102. In some embodiments, the interposer 104 receives the power and ground connections through solder-bumps 126 and 125 at the bottom of the interposer and provides the power and ground connections at the top of the interposer through two micro-bumps 101 and 103 respectively. In some embodiments, the interposer 104 includes a receiving location, e.g., in a die, on top of the interposer 104 such that the SOC 102 is placed, e.g., is installed or mounted, on top of the interposer 104 and connects to the two micro-bumps 101 and 103 on top of the interposer 104 to receive the power and ground connections. The interposer 104 includes a lower substrate section 108 and an upper dielectric/redistribution section 106. In some embodiments, the upper dielectric section 106 comprises one or more dielectric layers and includes different connection layers M1, M2, and M3 that are connected to each other by means of vias V2 and V3. In some embodiments, connection layer M3 is the lowest level of the connection layers that are connected to solder-bumps 122, 125, and 126 at the bottom of the interposer using through-silicon vias (TSVs) T that pass through lower substrate section 108. The connection layer M2 is on top of the connection layer M3 and the connection layers M2 and M3 are connected at one or more locations by means of vias V3. In addition, the connection layer M1 is on top of the connection layer M2 and the connection layers M1 and M2 are connected by means of vias V2 at one or more locations. Also, the connection layer M1 is connected to the micro-bumps 101, 103, 105, and 107 on top of the interposer by means of vias V1.

In some embodiments, the interposer 104 includes one or more circuits (not shown) that provide one or more output signals and receives one or more input signals. The one or more circuits of the interposer 104 may communicate with the substrate 120, e.g., receive the input signals and provide the output signals to the substrate 120 through solder-bumps 122 at the bottom of the interposer 104. In addition, the one or more circuits of the interposer 104 may communicate with the SOC 102 through the micro-bumps 107 at the top of the interposer 104. Also, the interposer 104 may receive signals from the substrate 120 through the solder-bumps 122 and may pass the signals through micro-bumps 107 to the SOC 102. Conversely, the interposer 104 may receive signals from the SOC 102 through the micro-bumps 107 and may pass the signals through solder-bumps 122 to the substrate 120. In some embodiments, the interposer 104 is an integrated chip. The steps of forming the interposer 104 are described with respect to FIGS. 3A, 3B, 3C, 3D, 3E, 3F, 3G, 3H, 3I, 3J, 3K, and 3L.

In some embodiments, the upper dielectric section 106 of the interposer 104 includes a connection layer fuse 118 and a capacitor 110. In some embodiments, the first connection layer fuse 118 is part of the connection layer M1 that connects one micro-bump 101 to another micro-bump 105. In some embodiments, the micro-bump 101 is connected to the power (P) connection and the micro-bump 105 is a fuse (F) micro-bump connection on top of the interposer 104. Thus, the connection layer fuse 118 is connected between a first micro-bump, i.e., the micro-bump 101, and a second micro-bump, i.e., the micro-bump 105, via a connection layer M1 and vias V1. In some embodiments, when the connection layer fuse 118 is healthy, the micro-bumps 101 and 105 are electrically connected to each other. Conversely, when the connection layer fuse 118 is blown, e.g., broken, the first and second micro-bumps 101 and 105 are electrically disconnected from each other.

The capacitor 110 includes a top metal plate 112, a bottom metal plate 116, and a dielectric layer 114 between the metal plates 112 and 116 according to the embodiments illustrated in FIG. 1. The top metal plate 112 is electrically connected to connection layer M1 and the bottom metal plate 116 is connected to connection layer M2 by means of a via V0. As shown in FIG. 1, when the connection layer fuse 118 is healthy the capacitor 110 is connected between the power connection and the ground connection and thus the SSN may transferred through capacitor 110 between the power connection and the ground connection. In some embodiments, when the connection layer fuse 118 is blown, the SSN is not drained, e.g., is not transferred through capacitor 110 from the power connection, micro-bump 101/solder-bump 125 to the ground connection, micro-bump 103/solder-bump 126.

In some embodiments, the connection layer fuse 118 is an e-fuse that is controlled through micro-bump 105 such that by applying a first voltage at the micro-bump 105 the e-fuse becomes connected and by applying a second voltage at the micro-bump 105 the e-fuse becomes disconnected.

In some embodiments, the interposer of FIG. 1 includes a plurality of receiving locations, e.g. a plurality of dice, on top of the interposer 104 such that a plurality of SOCs or memory chip/stacks are placed, e.g., are installed or mounted, on top of the interposer 104 in each receiving location, e.g., in each die. In some embodiments, the interposer 104 receives the power and ground connections through solder-bumps 126 and 125 at the bottom of the interposer 104 and provides the power and ground connections in each one of the plurality of receiving locations on top of the interposer 104 such that in each one of the plurality of receiving locations at the top of the interposer 104, micro-bumps 101 and 103 respectively provide the power and ground connections for a chiplet, e.g., a SOC 102, that is installed in each receiving location. In some embodiments, each one of the plurality of receiving locations includes a connection layer fuse 118 such that the connection layer fuse 118 is connected between the micro-bumps 101 and the micro-bump 105 on top of the interposer 104. A top view of the interposer 104, according to some embodiments, is described with respect to FIG. 5A. In some embodiments, two or more capacitors 110 are connected in series with separate connection layer fuses 118 between the power micro-bumps 101 and the ground micro-bump 103 at one or more receiving locations. In some embodiments, the capacitor 110 is metal-insulator-metal (MiM) capacitor. In some other examples, the capacitor 110 is metal-oxide-metal (MoM) capacitor.

In some embodiments, the SOC 102 measures a resistance between micro-bumps 101 and 105 and determines if the connection layer fuse 118 is healthy (resistance is about zero ohms) or if it is blown (resistance is a very high resistance or an open circuit). In some embodiments, one or more test circuits are placed in a receiving location and are connected to micro-bumps 101 and 105 of each receiving location to determine if the connection layer fuse 118 of the receiving location is healthy or if it is blown. In some embodiments, the test circuits may be additionally connected to the ground micro-bump 103 to test the capacitor 110 that is connected between micro-bumps 103 and 105. The test circuits are described with respect to FIG. 6.

Figure 2A:
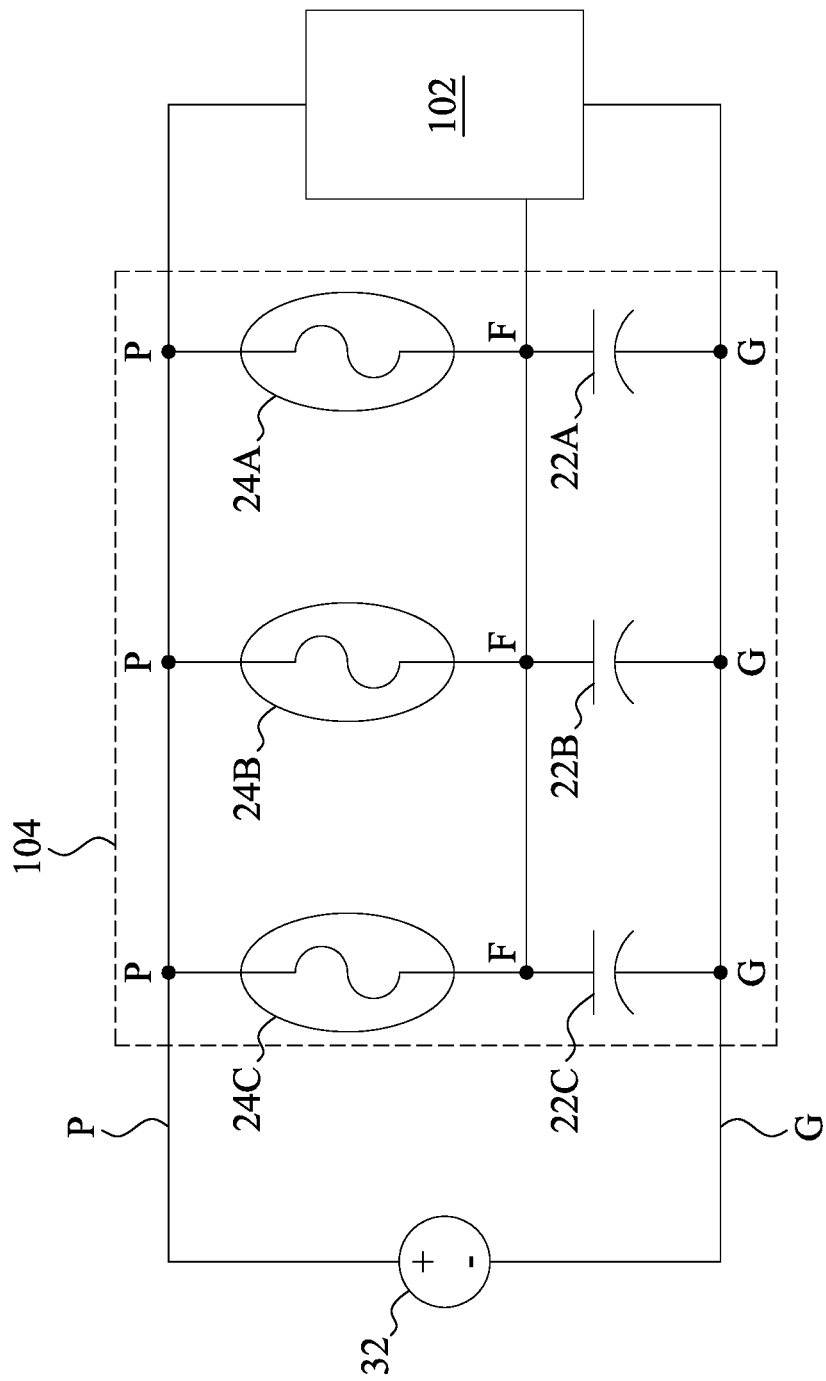
FIGS. 2A and 2B illustrate a circuit diagram of a SOC that is electrically connected to a power supply via an interface circuit having parallel capacitors that are protected by fuses in accordance with some embodiments of the present disclosure.
Figure 2B:
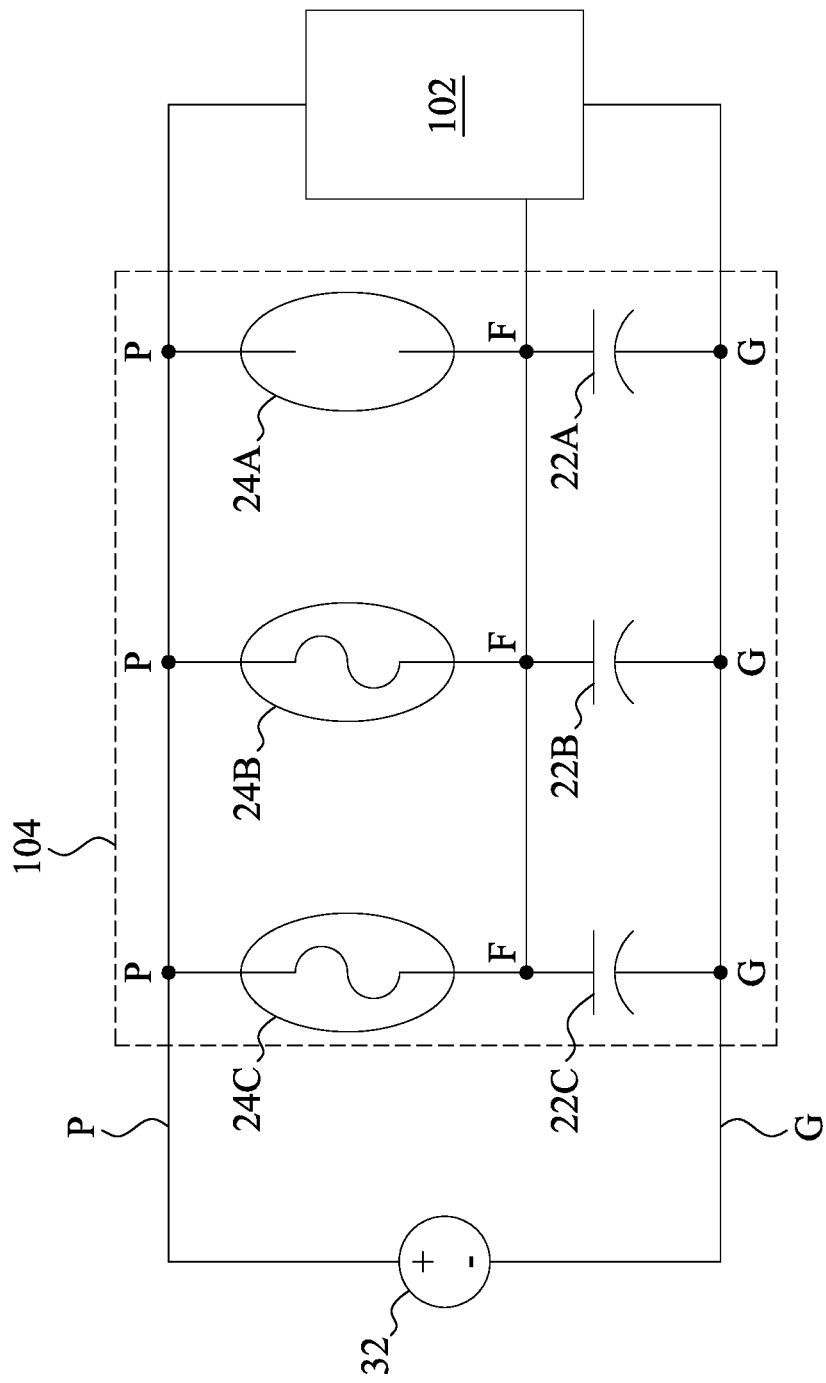

FIGS. 2A and 2B illustrate a circuit diagram of a SOC that is electrically connected to a power supply via an interface circuit having parallel capacitors that are protected by fuses in accordance with some embodiments of the present disclosure. In some embodiments, the interface circuit is consistent with the interposer 104 and includes one or more capacitors, e.g., three capacitors 22A, 22B, and 22C that are protected by three fuses 24A, 24B, and 24C. The capacitors 22A, 22B, and 22C are consistent with the capacitor 110 of FIG. 1 and the fuses 24A, 24B, and 24C are consistent with the connection layer fuse 118 of FIG. 1. In some embodiments, the interposer 104 is an integrated circuit chip. The interposer 104 includes a power connection line P, a connection line attached to a power node (positive node +) of power supply 32, and a ground connection line G, a connection line attached to a ground node (negative node −) of the power supply 32. As described, the power connection line P and the ground connection line G include parts of connection layers M1, M2, and M3 and one or more vias V1, V2, and V3 and are coupled to the power supply 32. In some embodiments, the positive and negative nodes of the power supply 32 are respectively the solder-bumps 125 and 126 of FIG. 1. As shown, the SOC 102 is connected through the interposer 104 to the power supply 32. The SOC 102 may be any circuitry, such as logic circuitry, analog circuitry, memory circuitry, or the like, and may comprise any combination of devices, such as passive devices like capacitors, inductors, or the like and active devices such as transistors. As shown, multiple serially coupled capacitors 22A, 22B, 22C (collectively "capacitors 22") and fuses 24A, 24B, and 24C (collectively "fuses 24"), respectively, are coupled in parallel between the power connection line P and the ground connection line G. In some embodiments, the capacitors 22A, 22B, and 22C are metal-insulator-metal (MiM) capacitors or the like. The fuses 24A, 24B, and 24C may be electric fuses, or e-fuses, or the like.

As shown in FIG. 2A, the fuses 24A, 24B, and 24C are proximate the power connection line P and the capacitors 22A, 22B, and 22C are proximate the ground connection line G; although, this may be switched. Also, additional capacitors may be serially coupled with each one of the fuses 24. In some embodiments, two capacitors and a fuse are serially coupled, or two capacitors are coupled together in parallel with each other and in series with the fuse.

In some embodiments, the power supply 32, is coupled to the substrate 120 and is a direct current (DC) power supply that provides a constant voltage difference between the power connection line P and the ground connection line G. With this constant voltage difference, the capacitors 22A, 22B, and 22C behave as an open circuit between the power connection line P and the ground connection line G. In some embodiments, when a voltage spike occurs between the power connection line P and the ground connection line G because of the SSN, the capacitors 22A, 22B, and 22C behave as short circuit between the power connection line P and the ground connection line G and the voltage spike is transferred from the power connection line P to the ground connection line G. In some embodiments, the higher the capacitors 22A, 22B, and 22C are or the more abrupt the voltage spikes are, the capacitors 22A, 22B, and 22C behave like to a short circuit.

In some embodiments, a defect may occur in one of capacitors 22. As shown in FIG. 2B, capacitor 22A may be defective. The defect may result from a manufacturing defect, a material breakdown (such as a dielectric material breakdown), a large spike in a voltage difference (such as from an electrostatic discharge (ESD) event), or the like. The defect may cause a short circuit in the capacitor 22A and may damage the dielectric layer of the capacitor 22A, which is consistent with the dielectric layer 114 of capacitor 110 of FIG. 1. A defective dielectric layer may allow leakage current to flow through the damaged capacitor 22A even when a DC voltage is applied to the nodes of the capacitor 22A. In some embodiments, when one of the capacitors 22, e.g., capacitor 22A, is defective, the fuse, e.g. the e-fuse 24A, in series with capacitor 22A is disconnected. In some embodiments, when the fuse 24A is not an e-fuse, the fuse 24A is blown by causing a large current to flow through the fuse 24A. This can allow the interposer 104 to remain functional despite the loss of the operation of the capacitor 22A and subsequent voltage spikes caused by the SSN may pass through the other capacitors 22B and 22C, which increases the overall reliability of the interposer 104. As shown in FIGS. 2A and 2B, each one of the capacitors 22A, 22B, and 22C in series with the fuses 24A, 24B, and 24C are connected at 3 connection points P, G, and F to the SOC 102. The 3 connection points are respectively consistent with the micro-bumps 101, 103, and 105 of FIG. 1.

Figure 3A:
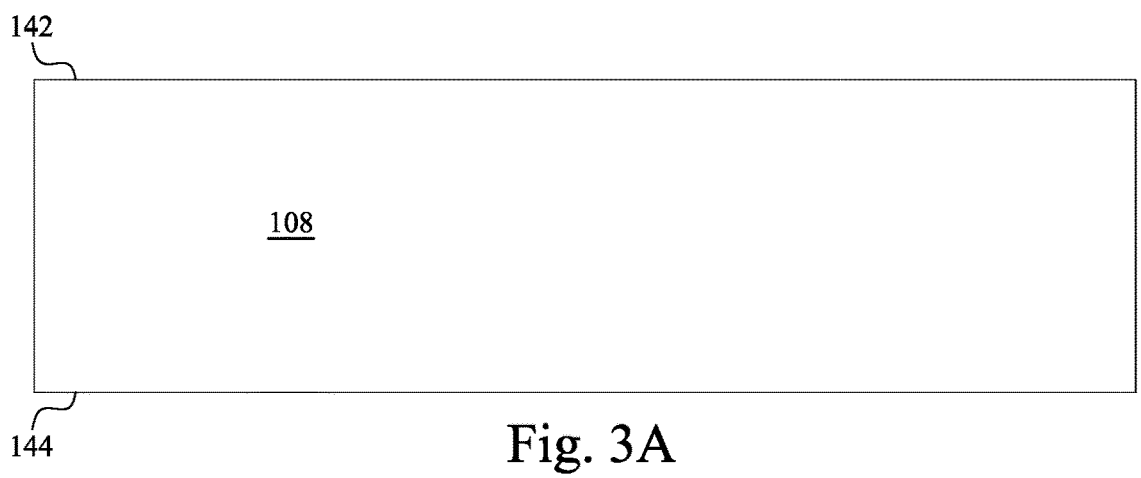
FIGS. 3A, 3B, 3C, 3D, 3E, 3F, 3G, 3H, 3I, 3J, 3K, and 3L illustrate cross sectional views of sequential steps of forming an interposer in accordance with some embodiments of the present disclosure.
Figure 3B:
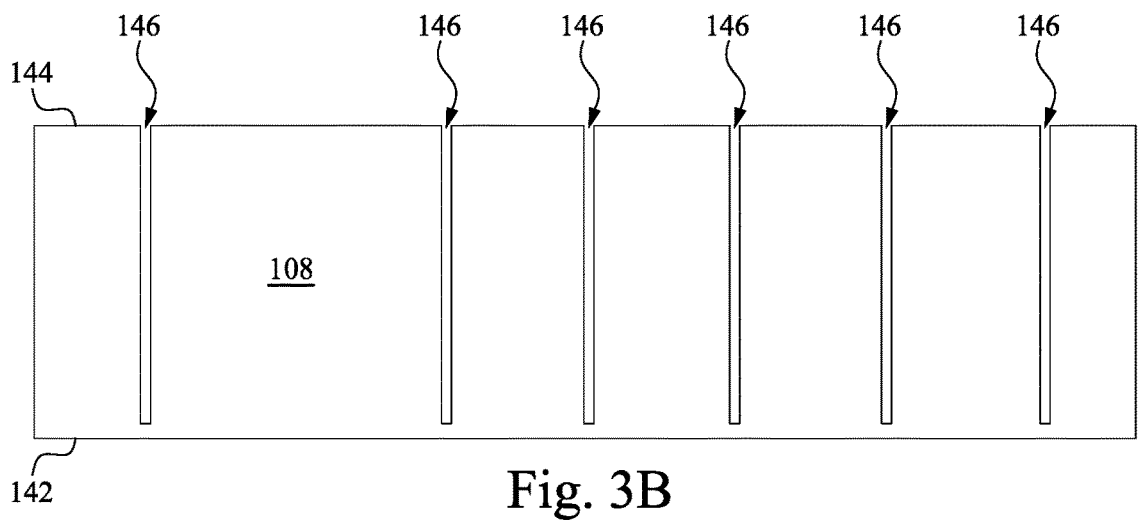
Figure 3C:
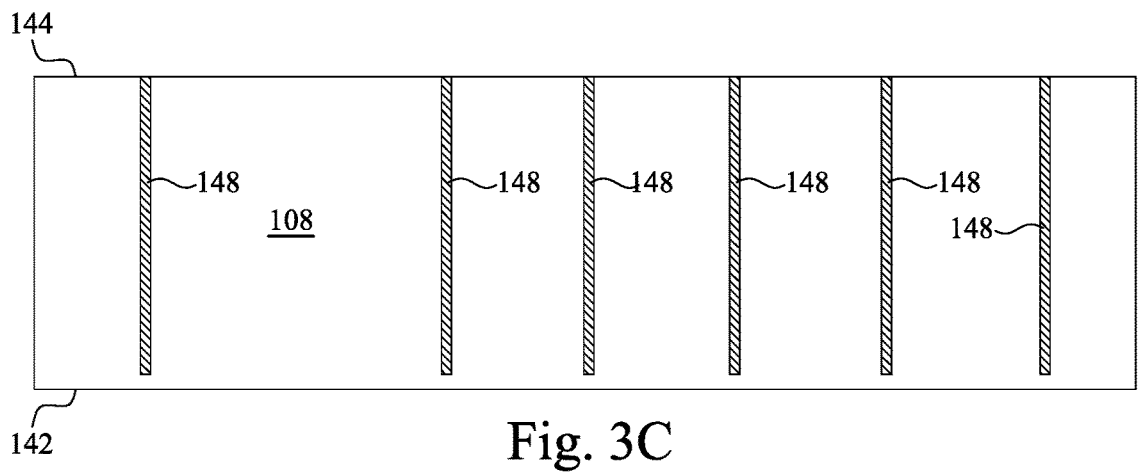
Figure 3D:
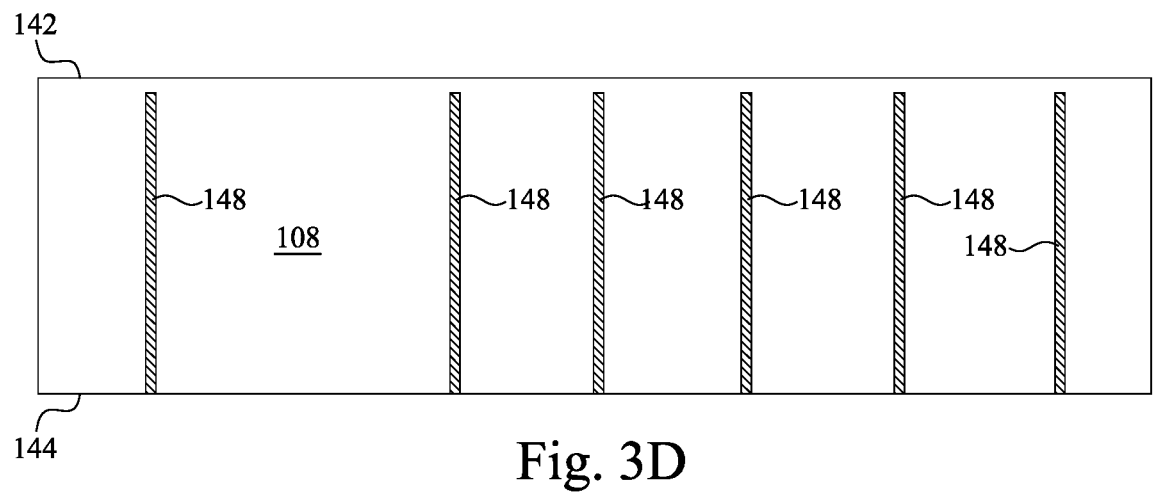
Figure 3E:
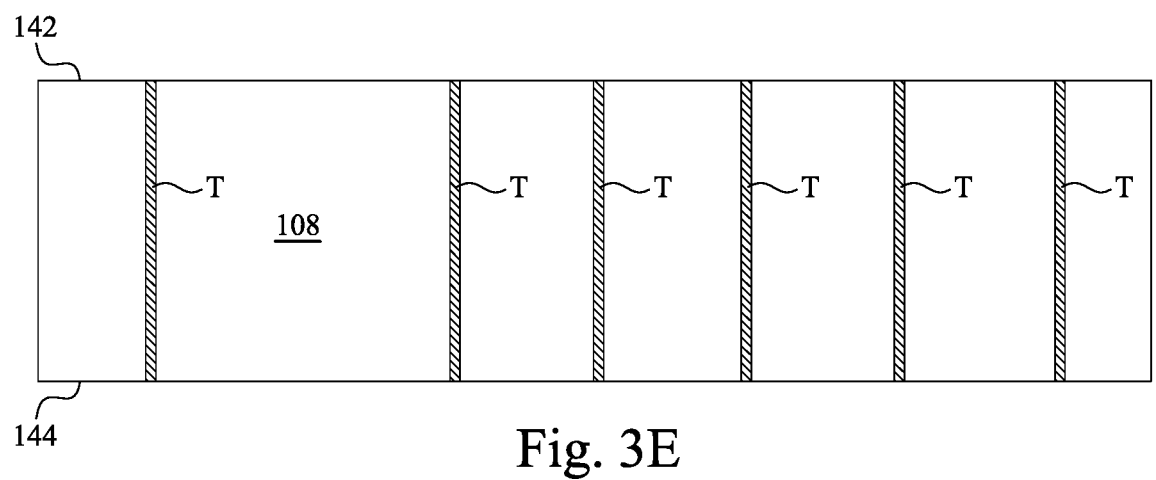
Figure 3F:
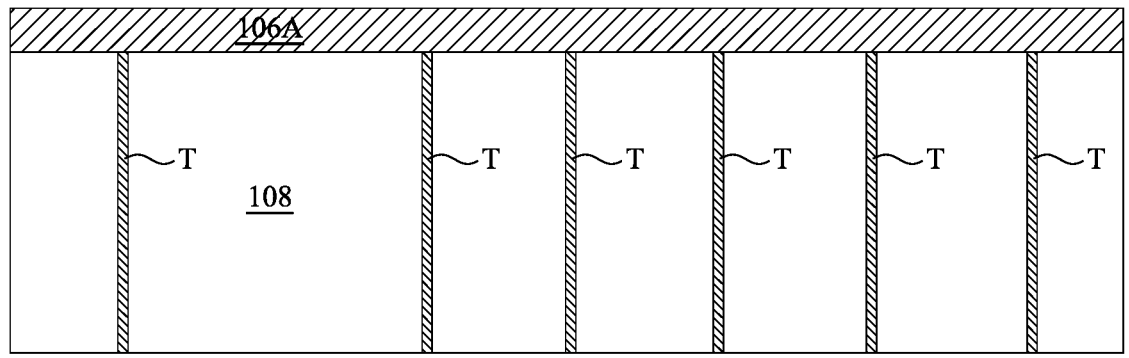

FIGS. 3A, 3B, 3C, 3D, 3E, 3F, 3G, 3H, 3I, 3J, 3K, and 3L illustrate cross sectional views of steps of forming an interposer in accordance with some embodiments of the present disclosure. FIG. 3A illustrates a substrate section 108 having an upper surface 142, a front side, and a lower surface 144, e.g., a backside. FIG. 3B shows the substrate section 108 that is that is flipped upside down such that the lower surface 144 is on top and upper surface 142 is at the bottom. FIG. 3B additionally includes a plurality of deep holes 146 that are formed into the substrate section 108 on the backside. FIG. 3C illustrates the substrate section 108 and the plurality of deep holes 146 of FIG. 3B, which the plurality of deep holes 146 are filled with a conductive material 148. The conductive material 148 may include copper, a copper alloy, aluminum, tungsten, silver, and the like. FIG. 3D illustrates the substrate section 108 and the filled plurality of deep holes of FIG. 3B that is flipped again such that the lower surface 144 is on the bottom and upper surface 142 is on top. As shown in FIG. 3D, the deep holes 146 filled with the conducting material 148 are exposed at the lower surface 144, however, the deep holes 146 filled with the conducting material 148 are not exposed at the upper surface 142. FIG. 3E shows the same substrate section 108 of FIG. 3D that the top surface is polished, e.g., with a chemical mechanical polishing (CMP) process or any polishing process, such that the deep holes 146 filled with the conductive material 148 are exposed at the upper surface 142. Thus, a plurality of TSVs T, filled with the conductive material 148, are formed in the substrate section 108. FIG. 3F illustrates a starting structure, the substrate section 108 of FIG. 3E having the plurality of TSVs T. A first overlying dielectric layer 106A is disposed on the substrate section 108. The substrate section 108 may include a semiconductor substrate on which devices, such as active and/or passive devices, may be formed. The semiconductor substrate section 108 may be a single crystalline, such as silicon, or a compound semiconductor substrate. Other layers (not shown), such as a contact etch stop layer, an inter-layer dielectric, and an inter-metal dielectric, may also be included in substrate section 108. The first overlying dielectric layer 106A may be formed of a low-k dielectric material, such as silicon oxide, tetraethyl orthosilicate (TEOS), phosphosilicate glass (PSG), borophosphosilicate glass (BPSG), fluorinated silicate glass (FSG), $SiO_xC_y$, spin-on-glass, spin-on-polymers, a silicon carbon material, a combination thereof, or the like, formed by any suitable method, such as by chemical vapor deposition (CVD), plasma enhanced CVD (PECVD), spinning, the like, or a combination thereof.

Figure 3G:
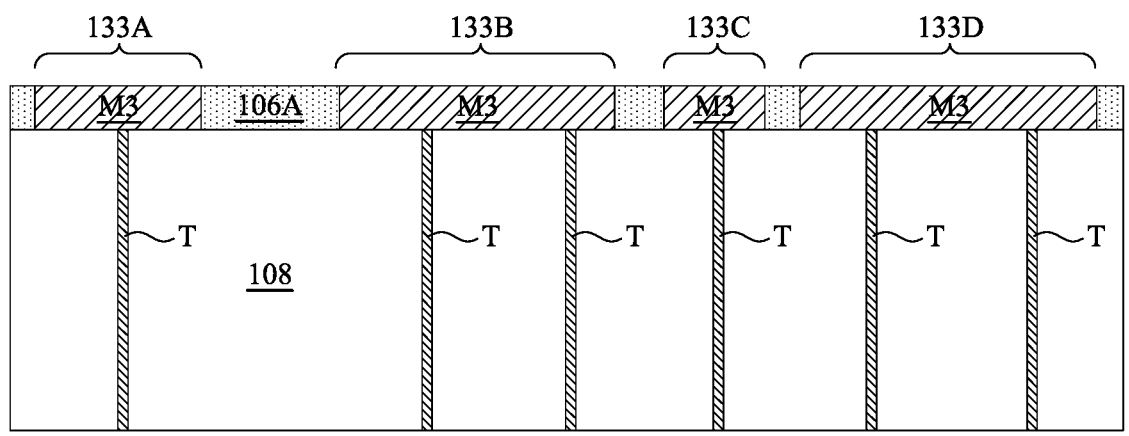

One or more recessed locations 133A, 133B, 133C, and 133D for forming a connection layer M3 are etched into the first overlying dielectric layer 106A, as shown in FIG. 3G. The etching process may be any acceptable etching process. The etching process may include forming and patterning a photoresist over the first overlying dielectric layer 106A, etching with an anisotropic etch, such as a reactive ion etch (RIE), buffered oxide etch (BOE), or the like, to transfer the pattern of the photoresist to the overlying dielectric layer 106A, and removing the photoresist with an appropriate ashing and/or stripping process. A conductive material is filled into the recessed locations 133A, 133B, 133C, and 133D to form the connection layer M3. The TSVs T pass through the substrate section 108 and electrically connect the connection layer M3 at the top of the substrate section 108 to the bottom of the substrate section 108. As described in FIG. 1, the TSVs T may connect to solder-bumps 122, 125, and 126 on top of the substrate 120, and thus, may electrically connect connection layer M3 to the substrate 120, e.g., to the circuits of the substrate 120.

Figure 3H:
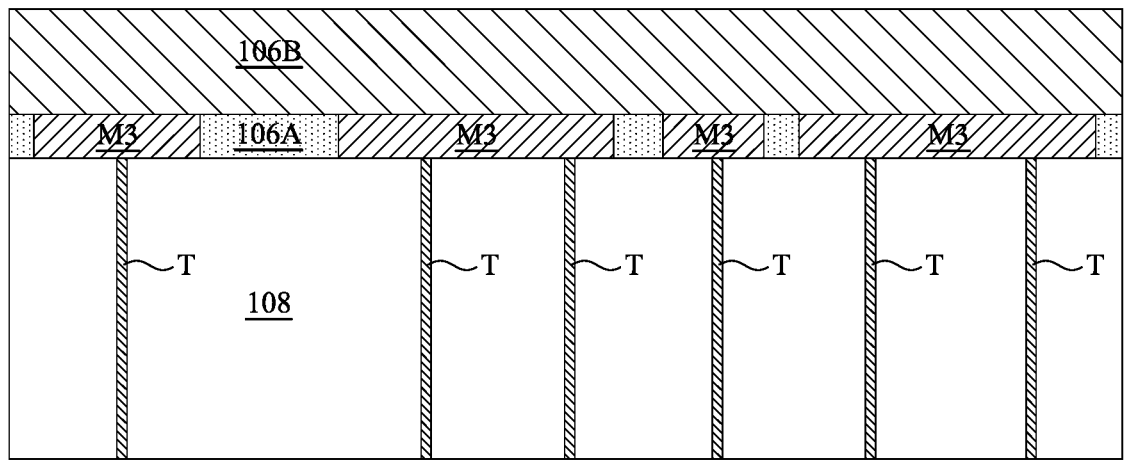
Figure 3I:
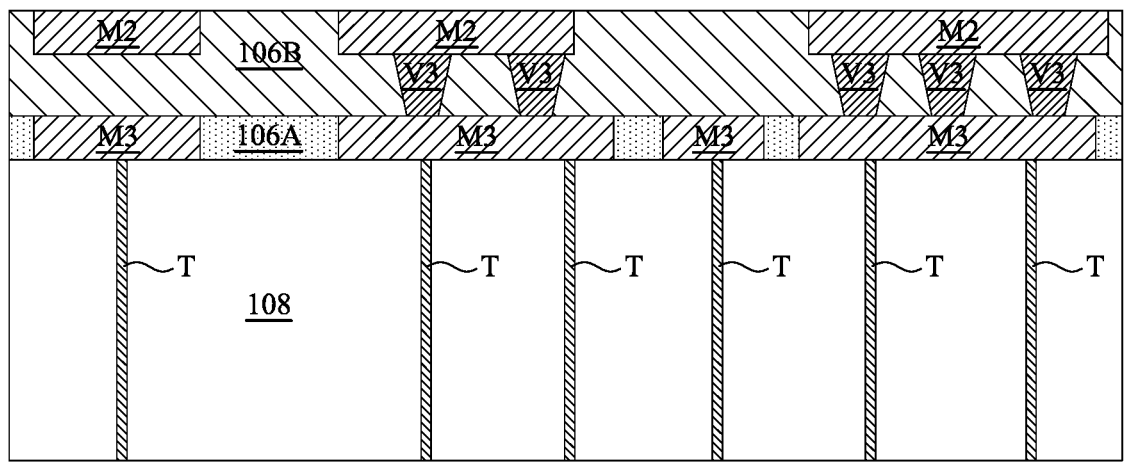

As shown in FIG. 3H, a second overlying dielectric layer 106B is disposed on the structure of FIG. 3G. The second overlying dielectric layer 106B may be made of a similar material as the first overlying dielectric layer 106A. One or more recessed locations 132A, 132B, and 132C for forming connection layer M2 are etched into the second overlying dielectric layer 106B, as shown in FIG. 3I. The etching process may be any acceptable process as described above. A conductive material is filled into the recessed locations 132A, 132B, and 132C to form the connection layer M2. In some embodiments, before creating the connection layer M2, a plurality of vias V3, filled with a conductive material, are created at the bottom of the recessed locations 132A-132C. The vias V3 pass through the second overlying dielectric layer 106B and electrically connect the connection layer M2 to the connection layer M3. The conductive material of the connection layer M2 and vias V2 are similar to the conductive material of the connection layer M3.

Figure 3J:
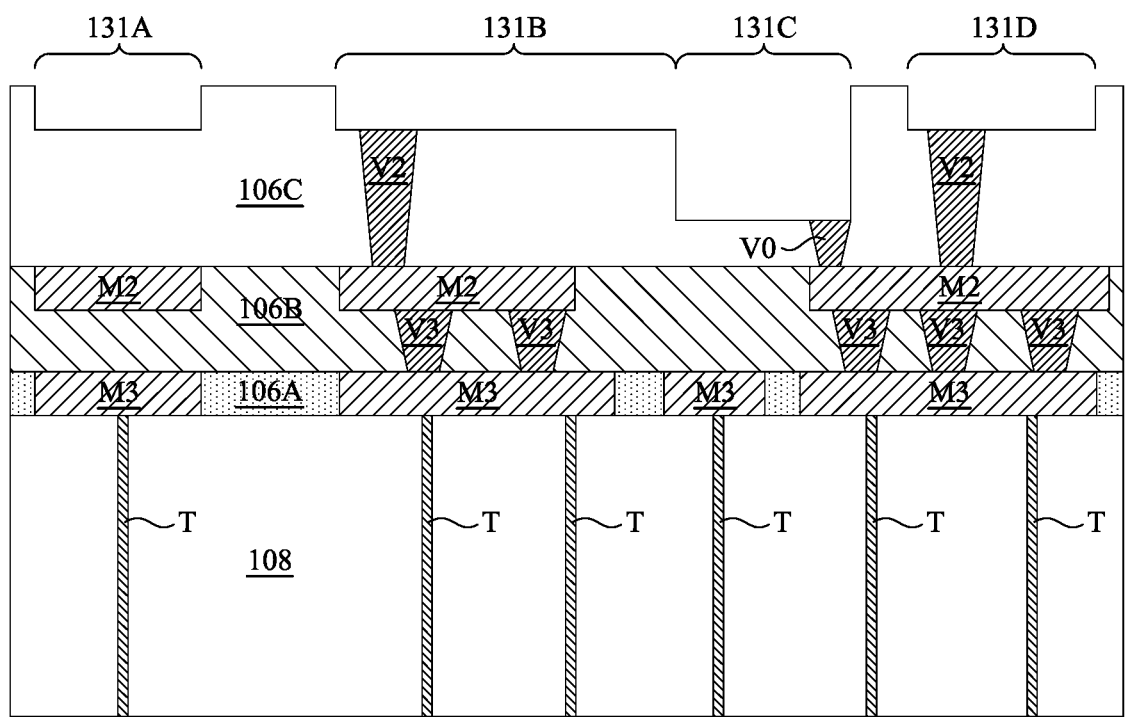
Figure 3K:
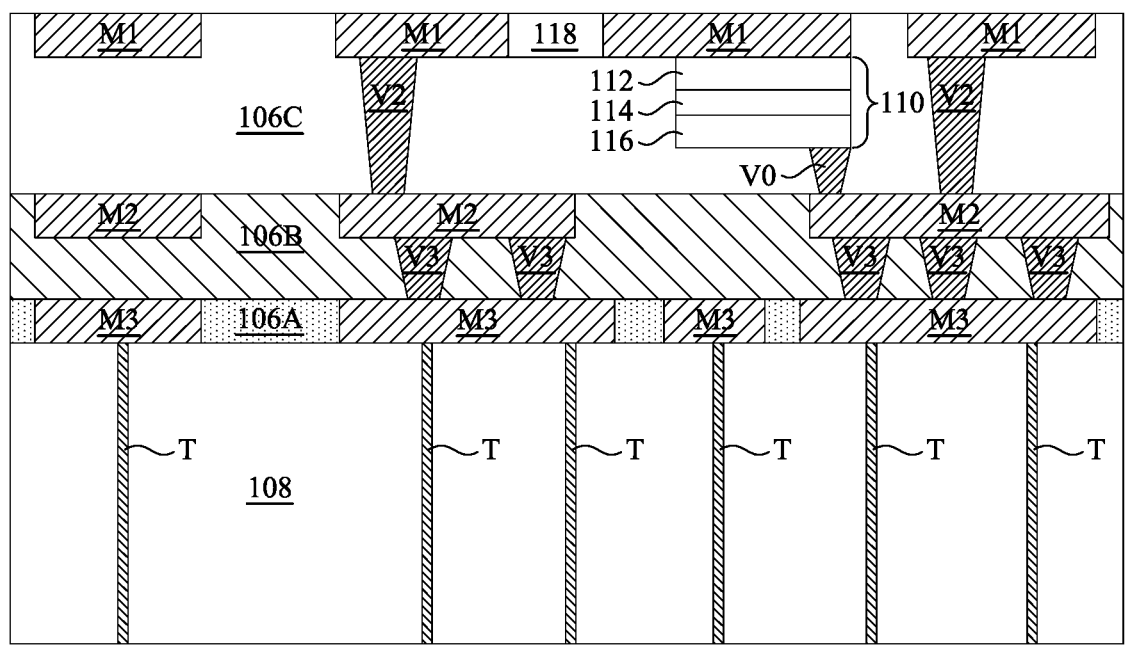

As shown in FIG. 3J, a third overlying dielectric layer 106C is disposed on the structure of FIG. 3I. The third overlying dielectric layer 106C may be made of a similar material as the first overlying dielectric layer 106A or the second overlying dielectric layer 106B. One or more recessed locations 131A, 131B, 131C, and 131D for forming connection layer M1 are etched into the third dielectric layer 106C. The etching process may be any acceptable process as described above. As shown in FIG. 3K, in addition to forming connection layer M1, the recess location 131B is also used for forming the connection layer fuse 118. The connection layer fuse 118 may be any acceptable fuse described with respect to FIGS. 4A, 4B, 4C, and 4D. Also, in addition to forming connection layer M1, the recessed location 131C is also used for forming the capacitor 110. In some embodiments, before creating the connection layer M1, a plurality of vias V2, filled with a conductive material, are created at the bottom of one or more recessed locations 131A or 131D. The vias V2 pass through the third dielectric layer 106C and electrically connect the connection layer M1 to the connection layer M2. In some embodiments, the recessed location 131C is etched with the same etching process and etching time as the recessed locations 131A, 131B, and 131D. Then, the recessed location 131C is further etched with the same etching process but the recessed locations 131A, 131B, and 131D are not further etched. In some embodiments, the depth ratio of the recessed locations 131A, 131B, and 131D to the depth ratio of the recessed location 131C is between 1:2 to 1:4, e.g., 1:3.

The conductive material of connection layer M1 filled into the recessed locations 131A-131D, the vias V2, the conductive material of top metal plate 112 of the capacitor 110, and the conductive material of bottom metal plate 116 of the capacitor 110 may be similar to the conductive material of the connection layers M2 and M3. In some embodiments, the bottom metal plate 116 of the capacitor 110 is electrically connected to the connection layer M2 by means of a via V0 having a conductive material similar to vias V1-V3.

In some embodiments as shown in FIG. 3K, at recessed location 131C, the via V0 is disposed at the bottom of the recessed location 131C to connect to connection layer M2. Then the bottom metal plate 116 of the capacitor 110, the dielectric layer 114 of the capacitor 110, and the top metal plate 112 of the capacitor 110 are disposed in the recessed location 131C. Finally, the connection layer M1 is disposed on top of the top metal plate 112 of the capacitor 110. In some embodiments, the connection layer M1 is electrically connected to the top metal plate 112.

Figure 3L:
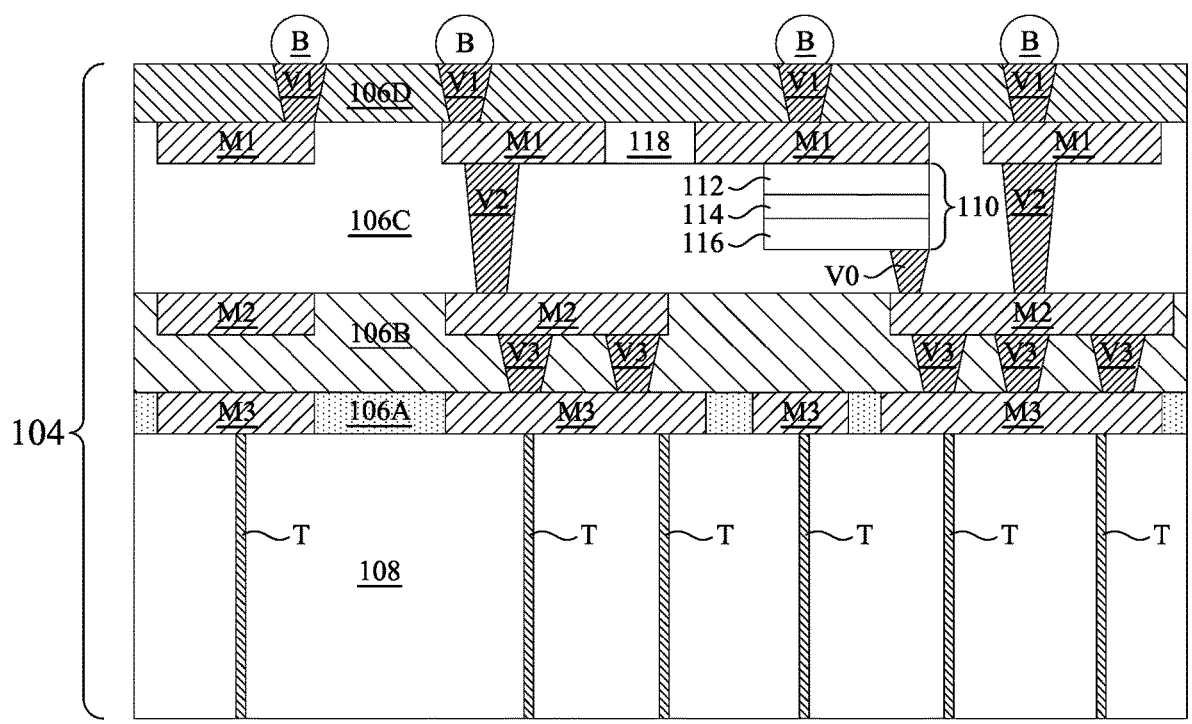

As shown in FIG. 3L, a fourth overlying dielectric layer 106D is disposed on the structure of FIG. 3F. In some embodiments, the overlying dielectric layers 106A, 106B, 106C, and 106D are collectively consistent with the upper dielectric section 106 of FIG. 1. As shown, vias V1 are disposed in the fourth overlying dielectric layer 106D to electrically connect the top of the fourth overlying dielectric layer 106D to the connection layer M1 at the bottom of the fourth overlying dielectric layer 106D. In some embodiments, one or more micro-bumps B which are consistent with the micro-bumps 101, 103, 105, and 107 of FIG. 1 are disposed on top of the vias V1 to electrically connect the one or more of the micro-bumps B to the connection layer M1. As described with respect to FIG. 1, the micro-bumps B may be used to electrically connect a circuit such as the SOC 102 of FIG. 1 to the interposer 104.

In some embodiments, multiple capacitors 110 and connection layer fuses 118 are stacked across multiple dielectric layers, such as the overlying dielectric layers 106A-106D of FIGS. 3F, 3G, 3H, 3I, 3J, 3K, and 3L, by repeating steps discussed herein. In such an embodiment, additional vias, metal plates 112 and 116, dielectric layers 114 are formed in the overlying dielectric layers 106A-106C, to create capacitors 110 and connection layer fuses 118 such that the connection layer fuses 118 are formed in series with the capacitors 110 in the connection layers M1-M3. In some embodiments, multiple capacitors 110 and connection layer fuses 118 are formed across two overlying dielectric layers 106A and 106B in FIG. 3L, in combination with one or more capacitors 110 and the connection layer fuses 118 in two other overlying dielectric layers e.g., overlying dielectric layers 106B and 106C of FIG. 3L. Although not specifically illustrated in FIGS. 1 and 3G, the connection layers M1-M3 may be electrically coupled to a circuitry, such as a circuitry in the substrate 120 of FIG. 1.

Figure 4A:
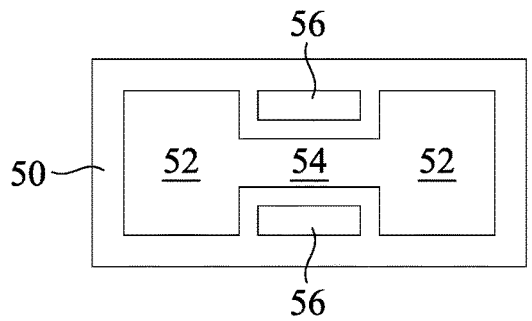
FIGS. 4A, 4B, 4C, and 4D illustrate various layout patterns of fuses that can be used in the interposer in accordance with some embodiments of the present disclosure.

FIGS. 4A, 4B, 4C, and 4D illustrate various layout patterns of connection layer fuses 118 used in an interposer in accordance with some embodiments of the present disclosure. FIG. 4A illustrates a first pattern of a fuse in the dielectric layer 50. The first pattern, which can include recesses filled with a conductive material, includes substantially rectangular contact pads 52 and a substantially rectangular fuse element 54 between the contact pads 52. The fuse element 54 has a smaller width than the contact pads. A ratio of a length of the fuse element 54 to the width of the fuse element 54 is between about 2 and about 50, e.g., 10, in some embodiments. To sustain the fuse blowing current without incurring damage, the contact pads 52 of the fuse may have a substantially greater width than the width of the fuse element 54. Substantially rectangular dummy portions 56 are formed on opposing sides of the fuse element 54 and disposed between the contact pads 52. In some embodiments, the fuse of FIG. 4A is disposed in the recess location 131B. In some embodiments, the dielectric layer 50 is same as the third overlying dielectric layer 106C. In some embodiments, the rectangular contact pads 52, fuse element 54, and the rectangular dummy portions 56 are disposed on top of the third overlying dielectric layer 106C. In some embodiments, the dielectric layer 50 is disposed on top of the third overlying the dielectric layer 106C and the rectangular contact pads 52, fuse element 54, and the rectangular dummy portions 56 are disposed on top of the dielectric layer 50. In some embodiments, the connection layer M1 is electrically connected to the contact pads 52 from both sides and thus any current passes in the connection layer M1 inside the recess location 131B passing through the fuse. In some embodiments, the dummy portions 56, 62, and 64 are made of a conductive material that is similar to the fuse element 54 and are disposed on top of the dielectric layer 50 to add strength to the structure of the fuse. Additionally, the dummy portions 56, 62, and 64 add uniformity such that when the location of the fuse is irradiated for annealing, temperature non-uniformity may not be created in the layer below the fuse.

Figure 4B:
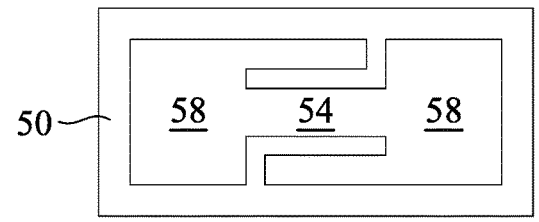

FIG. 4B is a second pattern of a fuse in the dielectric layer 50 according to some embodiments. This second pattern is similar to the first pattern in FIG. 4A, except the dummy portions 56 of FIG. 4A are integrated into respective contact pads 58 in FIG. 4B. The fuse of FIG. 4B can similarly be integrated into the connection layer M1 inside the recess location 131B.

Figure 4C:
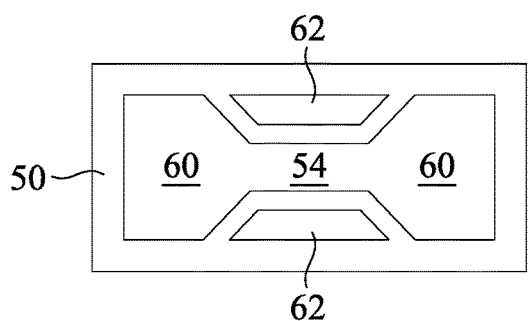

FIG. 4C is a third pattern of a fuse in the dielectric layer 50 according to some embodiments. This third pattern is similar to the first pattern in FIG. 4A, except the contact pads 60 are tapered to the fuse element 54 and the dummy portions 62 are modified to accommodate the tapering of the contact pads 60. The fuse of FIG. 4C can similarly be integrated into the connection layer M1 inside the recess location 131B.

Figure 4D:
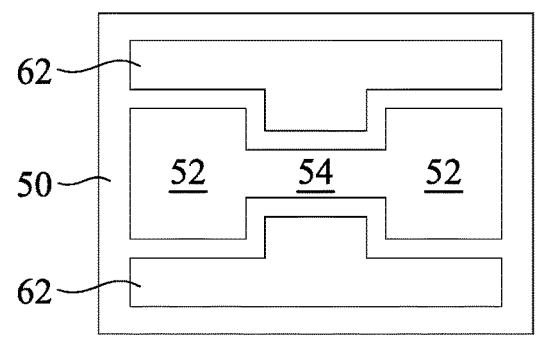

FIG. 4D is a fourth pattern of a fuse in the dielectric layer 50 according to some embodiments. This fourth pattern is similar to the first pattern in FIG. 4A, except the dummy portions 56 of FIG. 4A are modified to be dummy portions 64 that include additional portions that extend the length of the fuse pattern along the contact pads 52. The fuse of FIG. 4D can similarly be integrated into the connection layer M1 inside the recess location 131B.

Referring back to FIG. 1, the current passing between micro-bump 101 (the positive node) and micro-bump 103 (the ground) that goes through capacitor 110 also passes through the connection layer fuse 118. In some embodiments, when the capacitor 110 is defective and draws a large current, the connection layer fuse 118 is blown and the capacitor 110 is disconnected. In some embodiments, the connection layer fuse 118 is an electronic fuse and the micro-bump 105 through the connection layer M1 is connected to the electronic fuse to control the electronic fuse. Thus, the SOC 102 or another circuit that connects to the micro-bumps 101, 103, and 105 may control and electronic fuse and may turn the fuse on (connect) or off (disconnect). The fuse patterns illustrated in FIGS. 4A, 4B, 4C, and 4D are shown merely as examples. Other fuse patterns may be used.

Figure 5A:
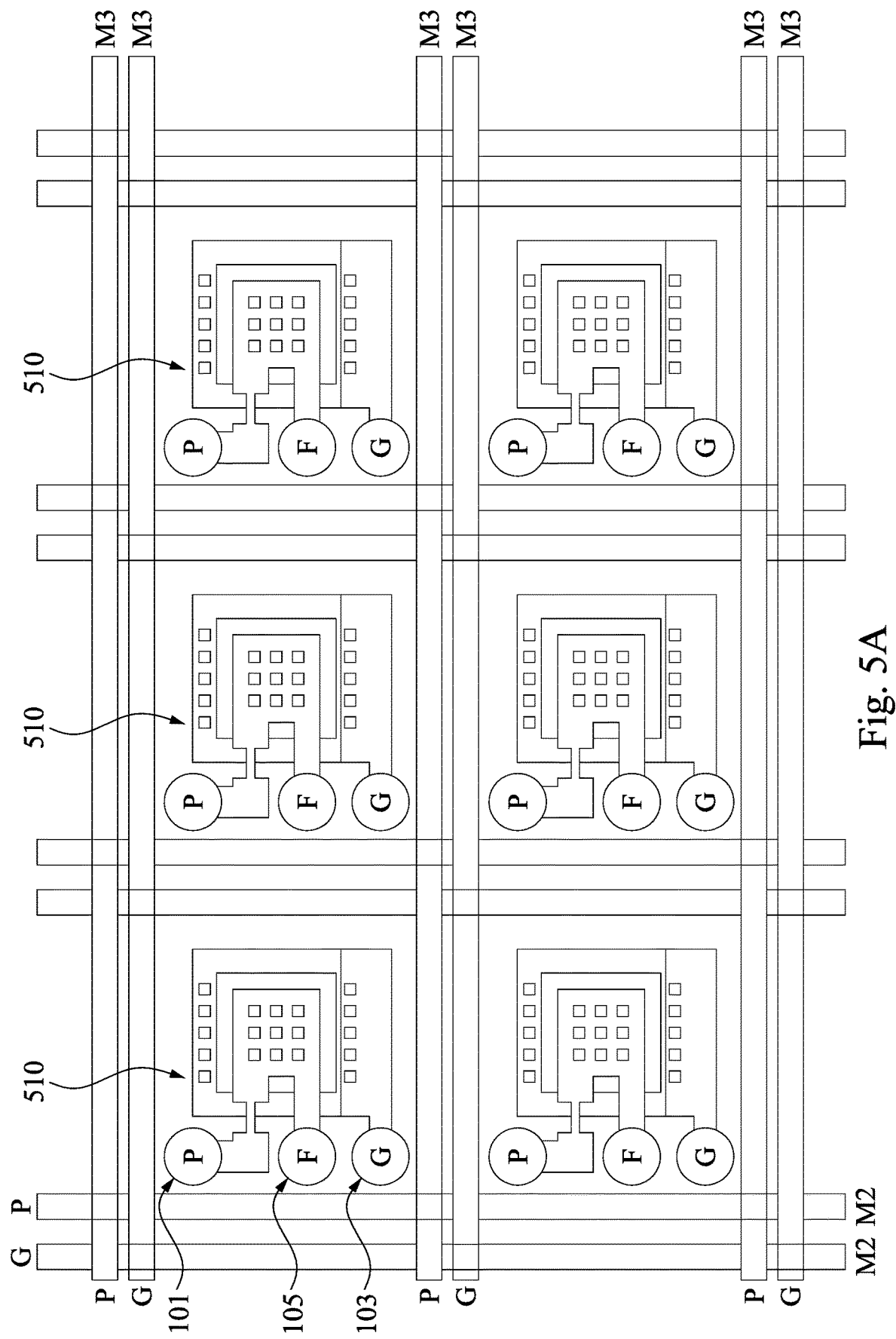
FIGS. 5A, 5B, and 5C illustrate a top cross sectional view of an interposer having multiple receiving locations for connecting to SOCs and each receiving location having one or more combinations of a fuse and a capacitor in series in accordance with some embodiments of the present disclosure.
Figure 5B:
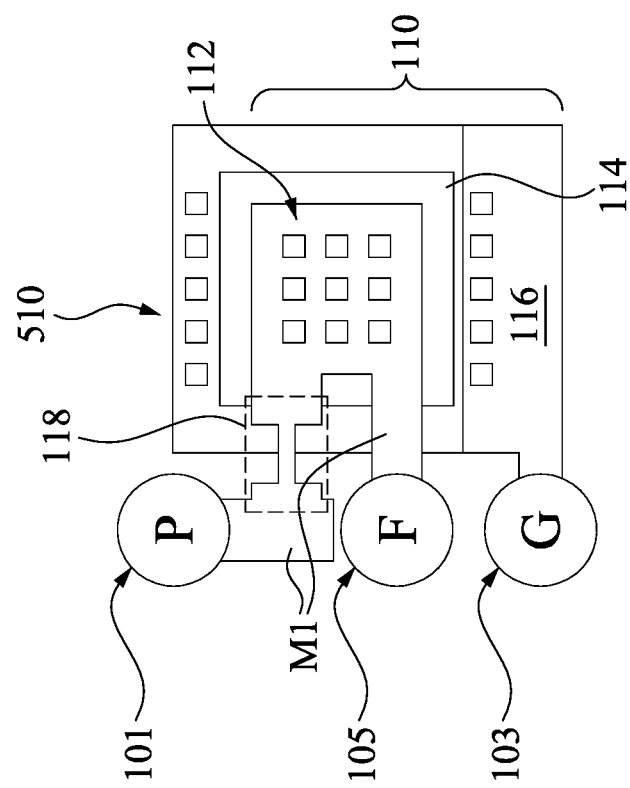
Figure 5C:
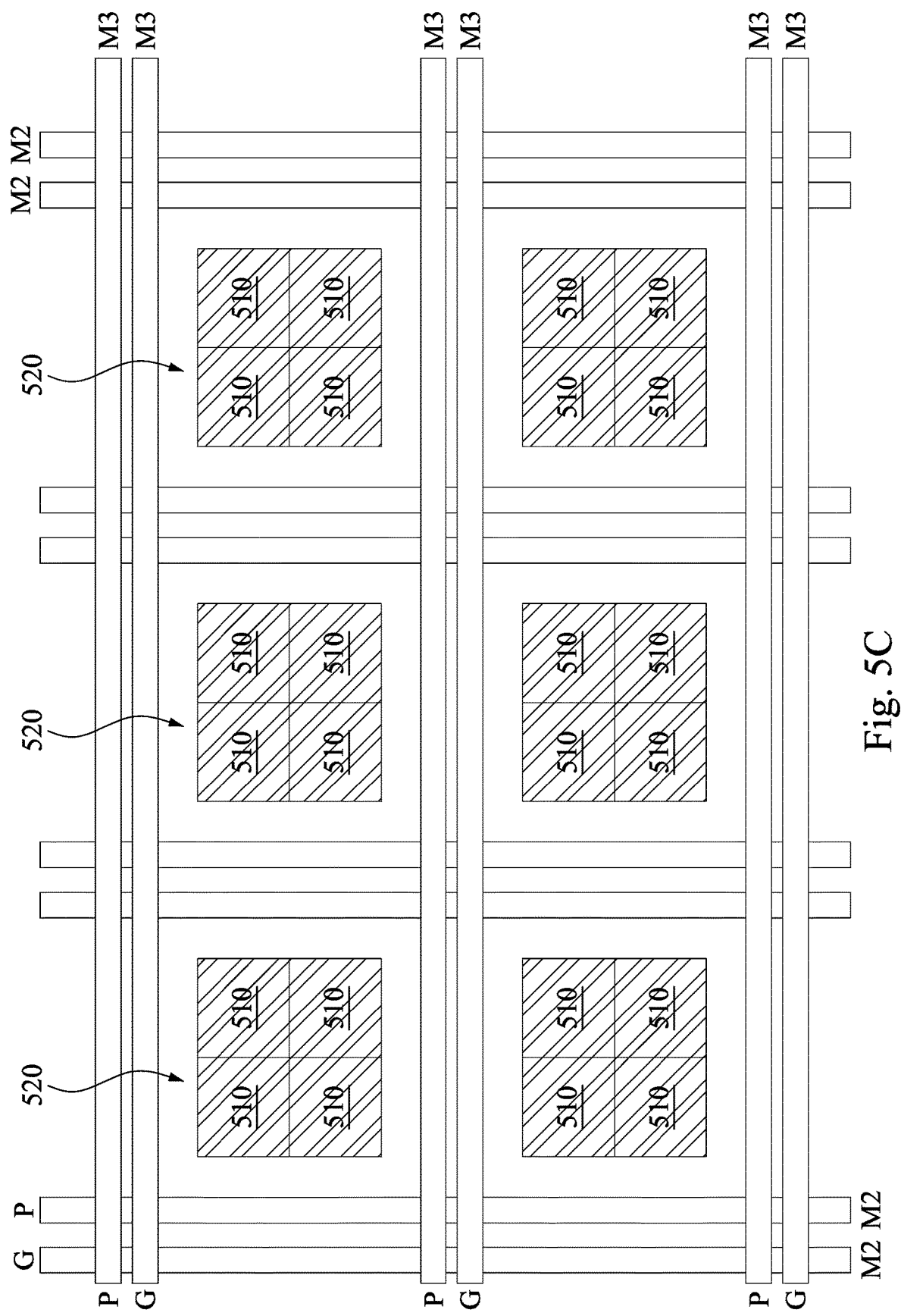

FIGS. 5A, 5B, and 5C illustrate a top cross sectional view of the interposer 104 of FIG. 1 having multiple receiving locations for connecting to SOCs and each receiving location having one or more combination of a fuse and a capacitor in series in accordance with some embodiments of the present disclosure. FIG. 5A shows a top view of an interposer 104 according to some embodiments. FIG. 5A shows two rows and three columns of the receiving location that includes six receiving locations. In each receiving location, a circuit 510 includes the combination of the capacitor 110, the connection layer fuse 118, connection layer M1, and the micro-bumps. In each receiving location, the micro-bumps 101, 103, and 105 are shown. The capacitor 110, the connection layer fuse 118, and the connection layer M1 are under the fourth overlying dielectric layer 106D. Also shown in FIG. 5A, are the connection layers M2 and M3 that are under two or three overlying dielectric layers. FIG. 5B shows the circuit 510 in more detail. FIG. 5B shows the connection layer M1 between micro-bumps 101 and 105 that includes the connection layer fuse 118 and the capacitor 110 having the top metal plate 112, the bottom metal plate 116, and the dielectric layer 114. The connection layer fuse 118 of FIG. 5B may be one of the fuses of FIGS. 4A, 4B, 4C, and 4D.

FIG. 5C, which is similar to FIG. 5A, shows that each receiving location includes a circuit unit 520 that includes more than one, e.g., four, circuits 510 as described with respect to FIG. 5B. In some embodiments, the circuits 510 of circuit unit 520 of FIG. 5C are rotated with respect to circuit 510 of FIG. 5B by zero degrees, 90 degrees, 180 degrees, or 270 degrees. Thus, each circuit 510 has at least one separate micro-bump 105 such that the leakage current of each capacitor 110 of each circuit 510 may separately be measured.

Figure 6:
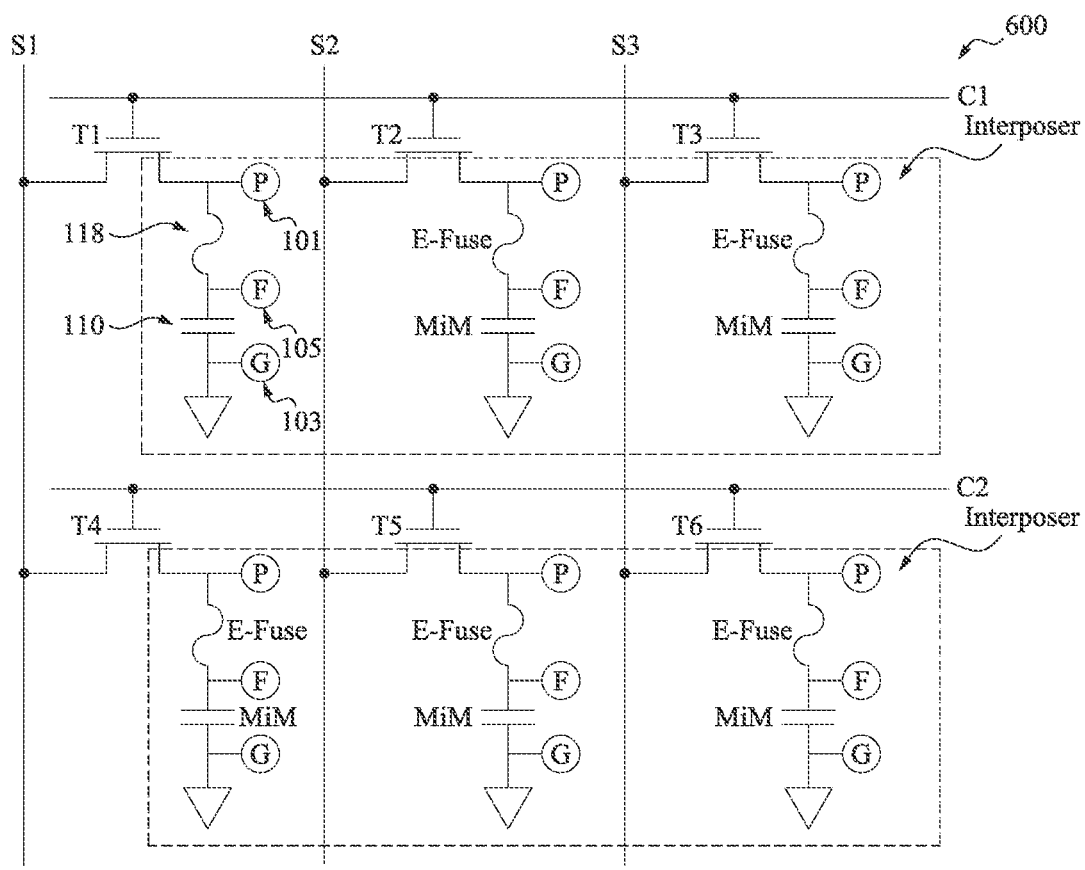
FIG. 6 illustrates a test circuit for assessment of multiple electrical connection locations in accordance with some embodiments of the present disclosure.

FIG. 6 illustrates a test circuit for assessment of the multiple electrical connection locations in accordance with some embodiments of the present disclosure. The test circuit 600 of FIG. 6 includes six test circuit in two rows and three columns consistent with the interposer of FIG. 5A. In some embodiments, when connection lines S1 and C1 become active, a transistor T1 turns on. In some embodiments, the test circuit 600 measures the leakage current of the capacitor 110 by measuring the current of the transistor T1 and if the current is above a limit, (e.g., 10 uA) the test circuit 600 determines that the capacitor 110 that is coupled to the transistor T1 has an unacceptable amount of leakage current and/or will harm the interposer. Based on the determination, the test circuit can induce excessive current between micro-bumps 101 and 105 to blow the fuse. Alternatively, if the connection layer fuse 118 is an electronic fuse the test circuit may turn the fuse off (disconnect the fuse). In some embodiments, the test circuit is included in a probe card.

In some embodiments, when the connection layer fuse 118 is blown or is turned off, the corresponding receiving location becomes inoperable. In some embodiments, the each receiving location includes multiple circuits of a capacitor in series with a fuse and multiple sets of micro-bumps 101, 103, and 105. In some embodiments, each circuit can be connected to by a separate set of micro-bumps 101, 103, and 105. The multiple circuits are connected in parallel across the nodes of the power source and thus by blowing one fuse, the capacitor in series with the blown fuse becomes disconnected, however, other capacitors replace the disconnected capacitor. In some embodiments, by alternatively activating different connection lines S1 or S2 and C1, C2, or C3 each one of the transistors T1-T6 can alternatively turn on and each one of the receiving locations is tested. In some embodiments, when the test circuit 600 is connected to micro-bumps 101 and 103, no power source is connected through the substrate 120 to the micro-bumps 101 and 103. In some embodiments and referring back to FIGS. 1 and 6, when the test circuit 600 is connected to micro-bumps 101 and 103, the interposer 104 is not disposed on the substrate 120 and the TSVs T are not connected to solder-bumps 122, 125, and 126 on top of the substrate 120 and thus no power supply is connected to connection layers M1-M3 and thus a leakage current of each capacitor 110 can separately be measured. In some embodiments, the connection layer fuse 118 is an e-fuse and before coupling the test circuit 600 to measure the leakage current of a capacitor 110, a connection layer e-fuse 118 is series with the capacitor 110 is turned off and thus the leakage current of the capacitor 110 can separately be measured. In some embodiments as shown in FIG. 5C, a receiving location includes more than one circuit 510 and the test circuit 600 or the SOC 102 may test the capacitor of each circuit 510 and if the capacitor is defective, the fuse is series with the defective capacitor is blown and the defective capacitor is disconnected.

Figure 7:
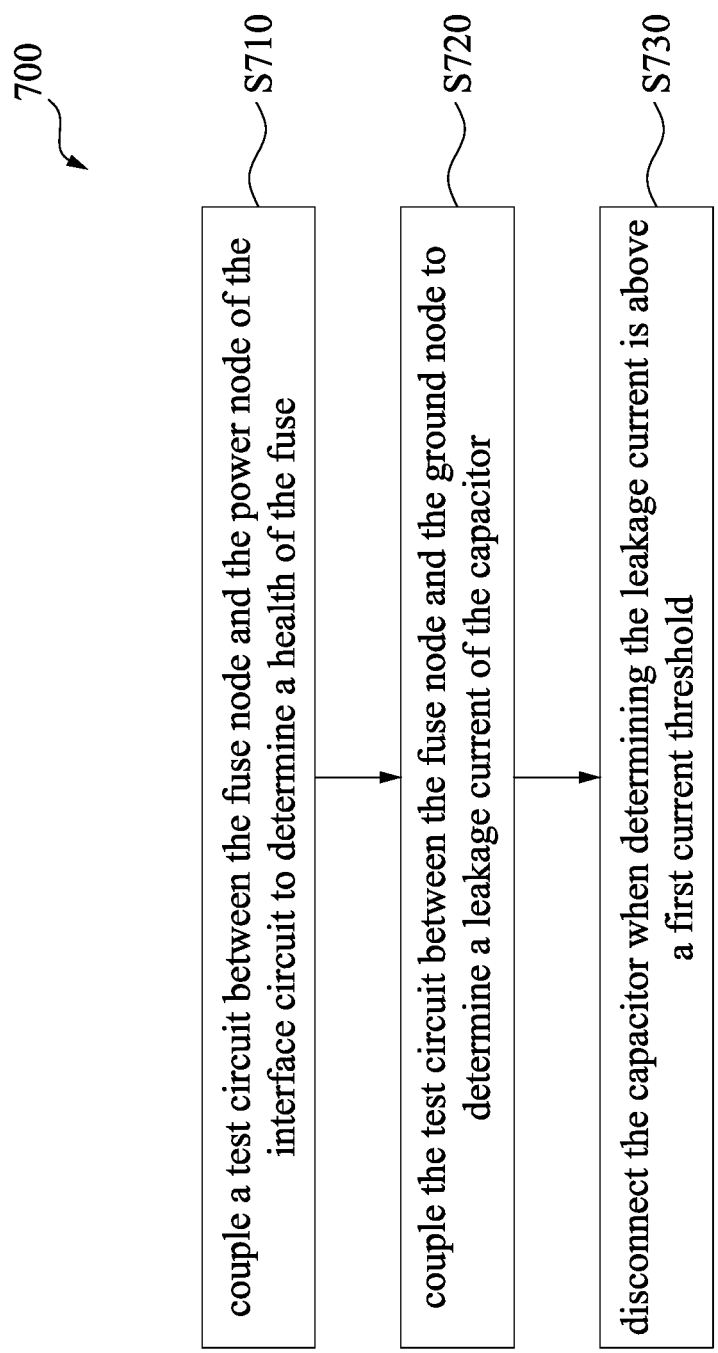
FIG. 7 illustrates a flow diagram of a process for using an interface circuit according to some embodiments of the disclosure.

FIG. 7 illustrates a flow diagram of an exemplary process 700 for using an interface circuit according to some embodiments of the disclosure. The interface circuit includes a power node, a fuse node, and a ground node; and includes a capacitor and a fuse, in series, between the power node and the ground node. In operation 5710, a test circuit is coupled between the fuse node and the power node of the interface circuit to determine a health of the fuse. In some embodiments, the test circuit 600 of FIG. 6 is coupled between the micro-bump 105 (fuse node) and the micro-bump 101 (power node) of an interface circuit, e.g., the interposer circuit 510 of FIGS. 5A and 5B to determine the health of the connection layer fuse 118. Upon determining the health of the connection layer fuse 118, in operation 5720, the test circuit is coupled between the fuse node and the ground node to determine a leakage current of the capacitor. In some embodiments, the test circuit 600 of FIG. 6 is electrically coupled between the micro-bump 105 (fuse node) and the micro-bump 103 (ground node) to measure a leakage current going from to micro-bump 103 (ground node) through the capacitor 110. In operation 5730, if it is determined that the leakage current is above a first current threshold (e.g., 10 uA), the capacitor is disconnected from the path between fuse node and the ground node. In some embodiments, the capacitor 110 is disconnected by blowing the connection layer fuse 118 that is in series with the capacitor between micro-bump 105 (fuse node) and the micro-bump 103 (ground node). In some embodiments, the interface circuit is consistent with interposer 104 of FIG. 1 that provides power between the micro-bump 101 (power node) and the micro-bump 103 (ground node) for a system-on-chip, e.g., SOC 102, that is disposed on the interposer 104.

According to some embodiments of the present disclosure, an interposer circuit includes a substrate and a dielectric layer disposed on top of the substrate. The interposer circuit also includes two or more connection layers that include a first connection layer and a second connection layer disposed at different depths of the dielectric layer. A fuse is disposed in the first connection layer. The first connection layer is coupled to a first power node and the second connection layer is coupled to a first ground node. A first capacitor in series with the fuse is connected between the first and the second connection layers. The interposer circuit further includes first, second, and third micro-bumps that are on top of the dielectric layer. The fuse is coupled between the first and second micro-bumps and the first capacitor is coupled between the second and third micro-bumps. The first and second micro-bumps are coupled to a power supply to provide a current to the fuse. In an embodiment, a test circuit electrically couples to the second and third micro-bumps to test a leakage current of the first capacitor. In an embodiment, the test circuit couples to the first and second micro-bumps to induce a first current in the fuse to blow the fuse. In an embodiment, the fuse is an e-fuse, and the e-fuse becomes disconnected by applying a first voltage between the first and second micro-bumps and the e-fuse becomes connected by applying a second voltage between the first and second micro-bumps. In an embodiment, the interposer circuit includes two or more through-silicon vias in the substrate to provide electrical connection between the two or more connection layers and a voltage source. The voltage source is coupled to the two or more through-silicon vias via at least two solder-bumps that are coupled to the through-silicon vias at a bottom of the substrate. In an embodiment, a second power node of the voltage source is electrically connected to the first power node via one or more through-silicon vias and the two or more connection layers. A second ground node of the voltage source is electrically connected to first ground node via the one or more through-silicon vias and the two or more connection layers. In an embodiment, the first capacitor is a metal-insulator-metal (MiM) capacitor or a metal-oxide-metal (MoM) capacitor.

According to some embodiments of the present disclosure, a chip on wafer on substrate (CoWoS) circuit includes a system on a chip (SOC) attached to an upper surface of an interposer. The interposer comprises one or more receiving locations at the upper surface of an interposer. The SOC is installed in a receiving location and a substrate is attached to lower surface of the interposer. Each receiving location of the interposer includes a circuit which has one or more combinations of a programmable e-fuse connected in series with a capacitor. The programmable e-fuse turns off if a capacitor associated with the e-fuse is defective. In an embodiment, a test circuit blows the fuse if an associated capacitor is defective. In an embodiment, the test circuit determines a leakage current of the associated capacitor and determines if the associated capacitor is defective based on the leakage current. In an embodiment, the capacitor is a metal-insulator-metal (MiM) or metal-oxide-metal (MoM) capacitor. In an embodiment, each receiving location of the interposer includes four circuits therein having a combination of a programmable e-fuse connected in series with a capacitor. In an embodiment, the SOC is attached to the four circuits and the associated capacitors of the four circuits. When a capacitor is defective the fuse associated with the capacitor is blown and the defective capacitor is disconnected. In an embodiment, a power connection is provided by the substrate through the interposer to the SOC. The four circuits are connected in parallel across a power node and a ground node of the power connection.

According to some embodiments of the present disclosure, a method of using an interface circuit, the interface circuit having a power node, a fuse node, and a ground node and also including a capacitor and a fuse, in series, between the power node and the ground node, includes coupling a test circuit between the fuse node and the power node of the interface circuit to determine a health of the fuse. The method includes after determining the fuse is healthy, coupling the test circuit between the fuse node and the ground node to determine a leakage current of the capacitor. The method further includes disconnecting the capacitor when determining the leakage current is above a first current threshold. In an embodiment, the disconnecting the capacitor includes blowing the fuse to disconnect the capacitor that is coupled between the power node and the ground node. In an embodiment, the method further includes coupling the test circuit between the fuse node and the power node to apply a current in the fuse that is larger than or equal to a second current threshold such that the second current threshold blows the fuse. In an embodiment, the interface circuit is an interposer circuit. In an embodiment, the interposer circuit is disposed on top of a substrate and the power node and the ground node are couple to a power source via the substrate. In an embodiment, a system-on-chip is disposed on top of the interposer circuit such that the system-on-chip is coupled to the power source via the interposer circuit.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interposer circuit, comprising:
a substrate;
a dielectric layer disposed on top of the substrate;
two or more connection layers including a first connection layer and a second connection layer disposed at different depths in the dielectric layer, wherein a fuse is disposed in the first connection layer, and wherein the first connection layer is coupled to a first power node and the second connection layer is coupled to a first ground node;
a first capacitor in series with the fuse and connected between the first and the second connection layers; and
first, second, and third micro-bumps on top of the dielectric layer, wherein the fuse is coupled between the first and second micro-bumps and the first capacitor is coupled between the second and third micro-bumps, wherein the first and second micro-bumps are coupled to a power supply to provide a current to the fuse.

2. The interposer circuit of claim 1, further comprising:
a test circuit configured to electrically couple to the second and third micro-bumps and to test a leakage current of the first capacitor.

3. The interposer circuit of claim 2, wherein the test circuit is configured to couple to the first and second micro-bumps to induce a first current in the fuse to blow the fuse.

4. The interposer circuit of claim 1, wherein the fuse is an e-fuse, and wherein the e-fuse is disconnected by applying a first voltage between the first and second micro-bumps and wherein the e-fuse is connected by applying a second voltage between the first and second micro-bumps.

5. The interposer circuit of claim 1, further comprising:
two or more through-silicon vias in the substrate to provide electrical connection between the two or more connection layers and a voltage source, and wherein the voltage source is coupled to the two or more through-silicon vias via at least two solder-bumps that are coupled to the through-silicon vias at a bottom of the substrate.

6. The interposer circuit of claim 5, wherein a second power node of the voltage source is electrically connected to the first power node via one or more through-silicon vias and the two or more connection layers, wherein a second ground node of the voltage source is electrically connected to first ground node via the one or more through-silicon vias and the two or more connection layers.

7. The interposer circuit of claim 1, wherein the first capacitor is a metal-insulator-metal (MiM) capacitor or a metal-oxide-metal (MoM) capacitor.

8. A chip on wafer on substrate (CoWoS) circuit, comprising:
a system on a chip (SOC) attached to an upper surface of an interposer,
the interposer comprises one or more receiving locations at the upper surface,
wherein the SOC is installed in a receiving location; and
a substrate attached to lower surface of the interposer, wherein each receiving location of the interposer includes a circuit therein having one or more combinations of a programmable e-fuse connected in series with an associated capacitor, and wherein the programmable e-fuse is configured to be turned off if the associated capacitor of the programmable e-fuse is defective, wherein each one of the one or more receiving locations comprises first, second, and third micro-bumps on the upper surface of the interposer, wherein the programmable e-fuse is coupled between the first and second micro-bumps and the associated capacitor is coupled between the second and third micro-bumps, and wherein the first and second micro-bumps are coupled to a power supply to provide current to the programmable e-fuse.

9. The CoWoS circuit of claim 8, wherein a test circuit is configured to blow the programmable e-fuse if the associated capacitor is defective.

10. The CoWoS circuit of claim 9, wherein the test circuit is configured to determine a leakage current of the associated capacitor to determine, based on the leakage current, if the associated capacitor is defective.

11. The CoWoS circuit of claim 8, wherein the associated capacitor is a metal-insulator-metal (MiM) or metal-oxide-metal (MoM) capacitor.

12. The CoWoS circuit of claim 8, wherein each receiving location of the interposer includes four circuits therein each having a combination of a programmable e-fuse connected in series with a capacitor.

13. The CoWoS circuit of claim 12, wherein the SOC is attached to the four circuits and associated capacitors of the four circuits, wherein when a capacitor is defective the programmable e-fuse associated with the capacitor is blown and the defective capacitor is disconnected.

14. The CoWoS circuit of claim 13, wherein a power connection is provided by the substrate through the interposer to the SOC and wherein the four circuits are connected in parallel across a power node and a ground node of the power connection.

15. An interposer circuit, comprising:
a substrate;
a dielectric layer disposed on top of the substrate;
two or more connection layers including a first connection layer and a second connection layer disposed at different depths in the dielectric layer, wherein a fuse is disposed in the first connection layer, and wherein the first connection layer is coupled to a power node and the second connection layer is coupled to a ground node;
a first capacitor in series with the fuse and connected between the first and the second connection layers;
first, second, and third micro-bumps on top of the dielectric layer, wherein the fuse is coupled between the first and second micro-bumps and the first capacitor is coupled between the second and third micro-bumps;
first and second solder-bumps at a bottom of the substrate, wherein the first solder-bump is coupled to the power node and the second solder-bump is coupled to the ground node; and
a test circuit.

16. The interposer circuit of claim 15, wherein:
the test circuit is electrically coupled between the second and third micro-bumps to measure a leakage current of the first capacitor.

17. The interposer circuit of claim 15, wherein the test circuit is electrically coupled between the first and second micro-bumps to supply a first current through the fuse, and wherein the first current is above a current threshold that is configured to blow the fuse.

18. The interposer circuit of claim 15, further comprising:
a system-on-chip configured to be disposed on top of the dielectric layer and to electrically couple to the power node and the ground node via the first micro-bump and the third micro-bump.

19. The interposer circuit of claim 15, wherein the interposer circuit is an interface circuit.

20. The interposer circuit of claim 15, wherein the fuse is an e-fuse, wherein the test circuit is electrically coupled between the first and second micro-bumps, and wherein the test circuit is configured to apply a first voltage between the first and second micro-bumps to disconnect the e-fuse and to apply a second voltage between the first and second micro-bumps to connect the e-fuse.

* * * * *